(12) United States Patent
Jefferies et al.

(10) Patent No.: US 9,466,417 B2
(45) Date of Patent: Oct. 11, 2016

(54) SELF-CORRECTING CURRENT TRANSFORMER SYSTEM

(71) Applicant: SCHNEIDER ELECTRIC USA, INC., Palatine, IL (US)

(72) Inventors: Kevin M. Jefferies, Raleigh, NC (US); Benjamin W. Edwards, Rolesville, NC (US); Matthew L. White, Raleigh, NC (US)

(73) Assignee: SCHNEIDER ELECTRIC USA, INC., Andover, MA (US)

( * ) Notice: Subject to any disclaimer, the term of this patent is extended or adjusted under 35 U.S.C. 154(b) by 60 days.

(21) Appl. No.: 14/526,793

(22) Filed: Oct. 29, 2014

(65) Prior Publication Data

US 2016/0124024 A1    May 5, 2016

(51) Int. Cl.

| G01R 15/18 | (2006.01) |
|---|---|
| H01F 27/42 | (2006.01) |
| H01F 27/24 | (2006.01) |
| H01F 27/28 | (2006.01) |
| H01F 27/40 | (2006.01) |
| G01R 35/02 | (2006.01) |
| H01F 38/28 | (2006.01) |

(52) U.S. Cl.
CPC ............ *H01F 27/42* (2013.01); *G01R 15/183* (2013.01); *G01R 35/02* (2013.01); *H01F 27/24* (2013.01); *H01F 27/2823* (2013.01); *H01F 27/402* (2013.01); *H01F 38/28* (2013.01); *H01F 2027/406* (2013.01)

(58) Field of Classification Search
CPC .. G01R 31/3277; G01R 15/18; G01R 17/02; G01R 19/0092; G01R 31/315; G01R 31/3627; G01R 33/07
See application file for complete search history.

(56) References Cited

U.S. PATENT DOCUMENTS

| 1,357,197 A | 10/1920 | Brooks |
| 3,534,247 A | 10/1970 | Miljanic |
| 3,668,513 A | 6/1972 | Tsubouchi et al. |

(Continued)

FOREIGN PATENT DOCUMENTS

| GB | 259 198 | 3/1927 |
| JP | H08 62261 | 3/1996 |

(Continued)

OTHER PUBLICATIONS

Extended European Search Report for Application No. 15183656.6-1568 dated Apr. 25, 2016.

*Primary Examiner* — Tung X Nguyen
(74) *Attorney, Agent, or Firm* — Locke Lord LLP

(57) ABSTRACT

A self-correcting current transformer 100 combines a current transformer 113 and self-calibration electronics 115 into one device. The current transformer has a sensor coil 106 with a number of turns that is less than a target number of turns, to cause a secondary current 205 induced in the sensor coil to be greater than a target secondary current 404 corresponding to the target number of turns. A measurement circuit 116 integrated with the transformer, determines an error signal 214 representing how much greater the secondary current is than the target secondary current and outputs the error signal. A current sink circuit 129 integrated with the transformer, shunts an amount of current 216 from the sensor coil, based on the error signal, to reduce a magnitude of the secondary current to match the target secondary current. The measurement circuit and the current sink circuit may be powered by the secondary current.

6 Claims, 5 Drawing Sheets

(56) References Cited

U.S. PATENT DOCUMENTS

| | | |
|---|---|---|
| 3,701,003 A | 10/1972 | Anderson |
| 4,262,209 A | 4/1981 | Berner |
| 4,660,889 A | 4/1987 | Anthony et al. |
| 5,451,939 A | 9/1995 | Price |
| 5,502,374 A * | 3/1996 | Cota .................... G01R 15/186 324/119 |
| 5,537,087 A | 7/1996 | Naito |
| 6,018,239 A | 1/2000 | Berkcan et al. |
| 6,018,700 A | 1/2000 | Edel |
| 6,188,146 B1 | 2/2001 | Michaels |
| 6,590,380 B2 | 7/2003 | Edel |
| 6,892,144 B2 | 5/2005 | Slater et al. |
| 7,102,478 B2 | 9/2006 | Pridmore, Jr. et al. |
| 7,158,012 B2 | 1/2007 | Wiesman et al. |
| 7,525,297 B2 | 4/2009 | Gibellini |
| 8,847,576 B1 | 9/2014 | Hannam et al. |
| 2007/0109088 A1 | 5/2007 | Askildsen et al. |
| 2008/0116825 A1* | 5/2008 | Descarries ........... H05B 37/032 315/302 |
| 2011/0156697 A1 | 6/2011 | Gunn |
| 2012/0038446 A1 | 2/2012 | McBee et al. |

FOREIGN PATENT DOCUMENTS

| | | |
|---|---|---|
| JP | 2007 205971 | 8/2007 |
| WO | WO2014010411 | 1/2014 |

\* cited by examiner

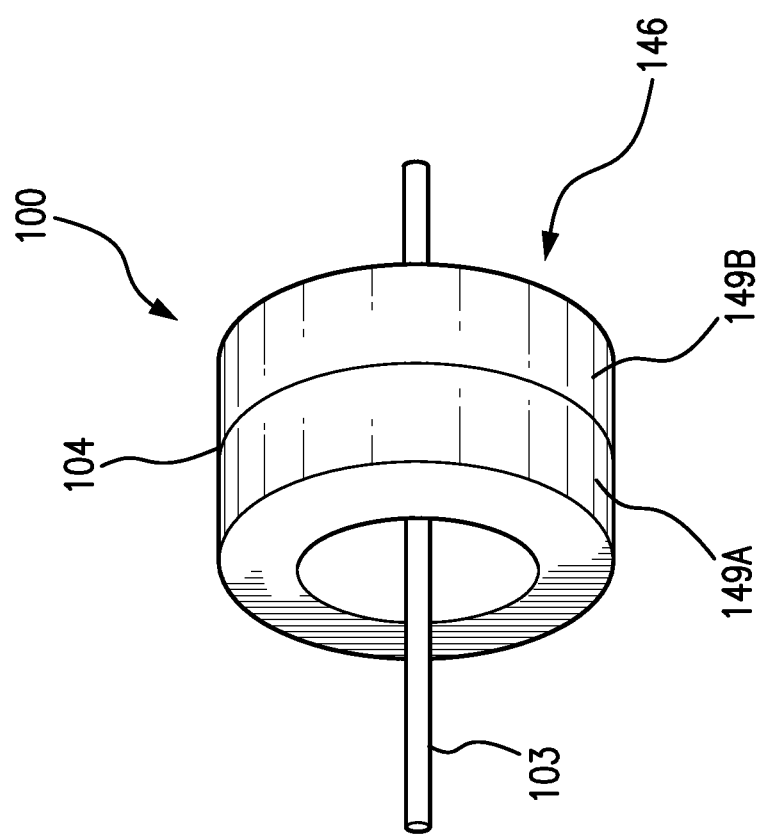

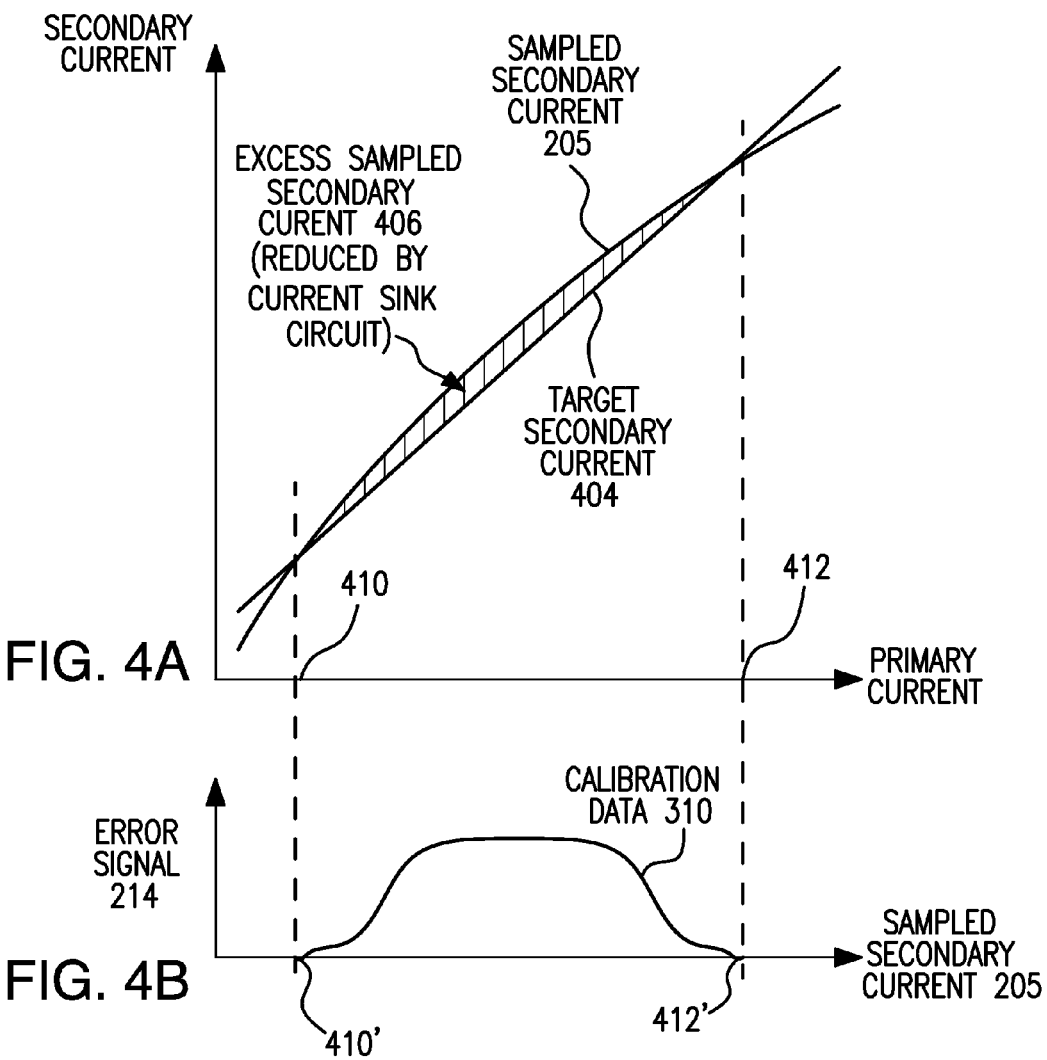

SELF-CORRECTING CURRENT TRANSFORMER SYSTEM

BACKGROUND OF THE INVENTION

1. Field of the Invention

The invention disclosed relates to current transformers.

2. Discussion of the Related Art

Current transformers (CTs) are commonly used for monitoring the current in a primary current carrying wire, by measuring with an ammeter or similar device, the induced secondary current in the transformer's sensor coil. An ideal current transformer would deliver to its sensor coil a perfectly accurate ratio of current applied to the primary current carrying wire, enabling the use of a simple ammeter or similar device for measurement. Unfortunately, magnetic losses in the core material of the transformer lead to varying degrees of accuracy. An accurate current transformer with low loss core materials is quite expensive, because of the extensive sampling and testing of the core material that contributes to the accuracy. If a designer were to choose a relatively lower accuracy current transformer for an application, any advantage accruing from a lower cost device will be outweighed by the cost of additional circuitry that must be used in the designer's application, to correct for the lower accuracy. The designer's application will need to include calibration to compensate for a low accuracy transformer's performance characteristics.

SUMMARY OF THE INVENTION

These problems are addressed and solved by the subject invention. The subject Self-Correcting Current Transformer System invention provides a simplified method for the selection of a current transformer for a particular application, by combining a current transformer and self-calibration electronics into a single device. The invention uses a current transformer with a sensor coil having a number of turns that is less than a target number of turns, to cause a secondary current induced in the sensor coil to be greater than a target secondary current corresponding to the target number of turns. A measurement circuit integrated with the current transformer, samples the secondary current as a measure of a primary current. The measurement circuit includes calibration data to determine an error signal representing how much greater the sampled secondary current is than the target secondary current, and outputs the error signal. The calibration data is prepared at the time of manufacture of the transformer. A current sink circuit integrated with the current transformer, receives the error signal and shunts a corresponding amount of current from the sensor coil to reduce a magnitude of the secondary current to match the target secondary current. The measurement circuit and the current sink circuit may be powered by the secondary current from the sensor coil.

In this manner, no additional circuitry or calibration is required in the designer's application, to compensate for a current transformer's performance characteristics.

BRIEF DESCRIPTION OF THE FIGURES

FIG. 1C illustrates the example embodiment of the invention, showing the self-correcting current transformer of in FIG. 1B, enclosed in a two piece housing.

FIG. 4A illustrates an example graph of secondary current vs primary current for the self-correcting current transformer of FIG. 3.

FIG. 4B illustrates an example graph of an error signal output from the measurement circuit vs the secondary current for the self-correcting current transformer.

DETAILED DESCRIPTION OF EMBODIMENTS OF THE INVENTION

Design applications requiring current measurement using a current transformer, typically have a design requirement of a particular magnitude or range of primary current to measure and a design requirement of a particular range or magnitude of output secondary current that is compatible with downstream electronics. A required magnitude of secondary current is refereed to herein as a "target secondary current". For a primary current of the required magnitude flowing through the current transformer, a sensor coil having a number of turns sufficient to output the target secondary current, is referred to herein as a sensor coil with a "target number of turns".

In an example embodiment of the invention, the current transformer has a sensor coil with a number of turns that is less than a target number of turns, to cause a secondary current induced in the sensor coil by the required primary current, to be greater than the target secondary current corresponding to the target number of turns. A measurement circuit integrated with the current transformer, samples the secondary current as a measure of the primary current. The measurement circuit includes calibration data to determine an error signal representing how much greater the sampled secondary current is than the target secondary current and outputs the error signal. The error signal is determined based on calibration data prepared at the time of manufacture of the transformer, to adjust the secondary current. A current sink circuit integrated with the current transformer, receives the error signal and shunts a corresponding amount of current from the sensor coil to reduce a magnitude of the secondary current to match the target secondary current.

Figure 1B:
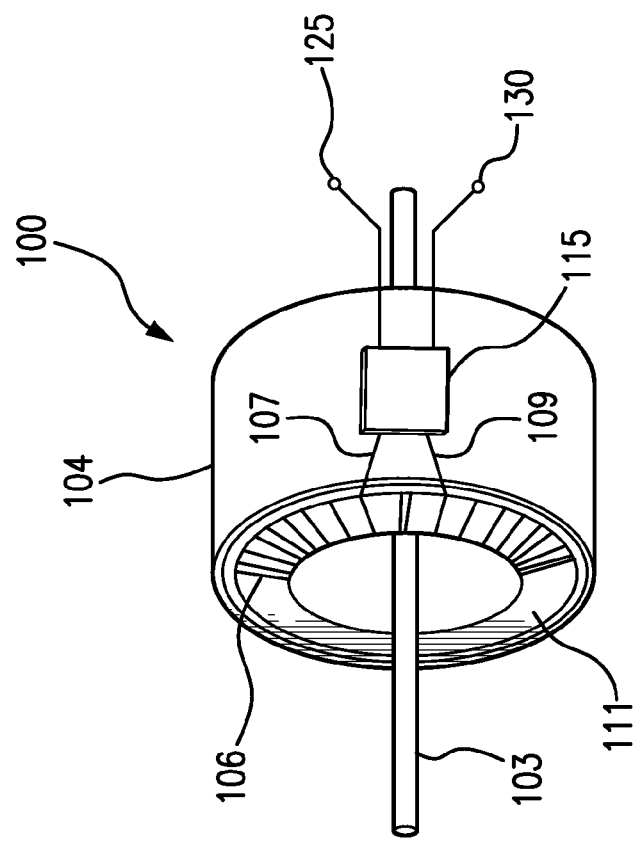
FIG. 1B illustrates an example embodiment of the self-correcting current transformer invention, wherein the current transformer of FIG. 1A, has an integrated measurement circuit electrically connected to leads from the sensor coil.
Figure 1A:
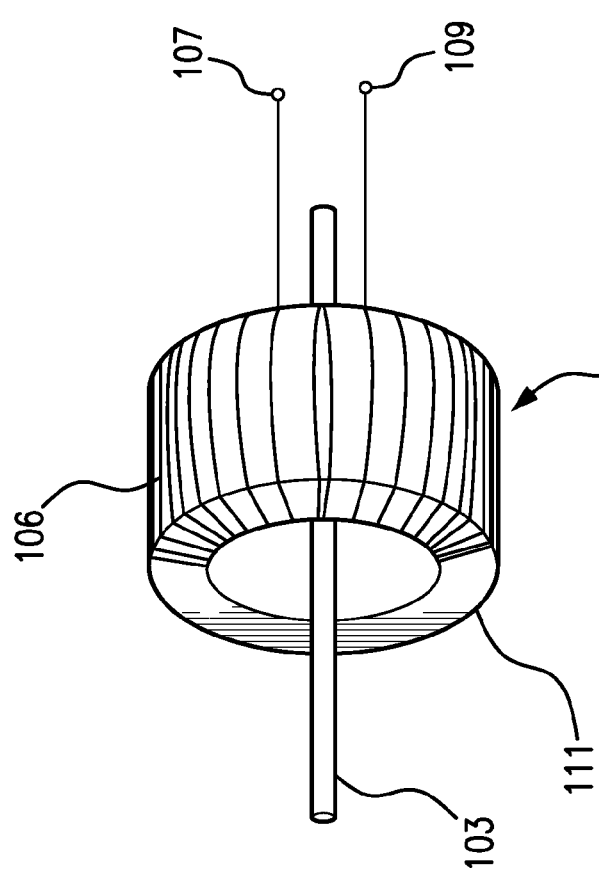
FIG. 1A illustrates an example building block of the invention, showing a sensor coil of wire, operating as a secondary coil, wound as a toroidal coil about a toroidal core, having a primary current carrying wire threaded through the toroidal core's center, forming a current transformer.

FIG. 1A illustrates an example building block of the invention, showing a sensor coil or secondary coil 106 of wire, wound as a toroidal coil about a toroidal core 111, having a primary current carrying wire 103 threaded through the toroidal core's center, forming a current transformer 113. The current transformer 113 couples the primary 103 and secondary 106 coils, so that the secondary current is approximately proportional to the primary current. The current transformer's primary circuit consists of a single turn of conductor 103, with a secondary 106 of many tens or hundreds of turns. The current transformer's sensor coil 106 has a number of turns that is less than a target number of turns, to cause the secondary current induced in the sensor coil 106 to be greater than a target secondary current corresponding to the target number of turns. In alternate embodiments, the core may be a laminated core or an E-core. In alternate embodiments, the primary circuit may have multiple primary turns, or multiple passes of the primary may be made through an open window style current transformer.

FIG. 1B illustrates an example embodiment of the self-correcting current transformer 100, wherein the current transformer 113 of FIG. 1A, has a flexible printed circuit board 104 wrapped about the outside circumference of its toroidal coil 106. Measurement and signal conditioning circuits 115 on the printed circuit board 104, are electrically connected to leads 107 and 109 from the sensor coil 106, to sample secondary current induced in the sensor coil 106 as a measure of primary current in the primary current carrying wire 103. FIG. 1C illustrates the example embodiment of the invention, showing the self-correcting current transformer of in FIG. 1B, enclosed in a two piece housing 146 comprising mating covers 149A and 149B, which may be composed, for example, of an organic polymer plastic or a ceramic material having electrically insulating properties.

Figure 2:
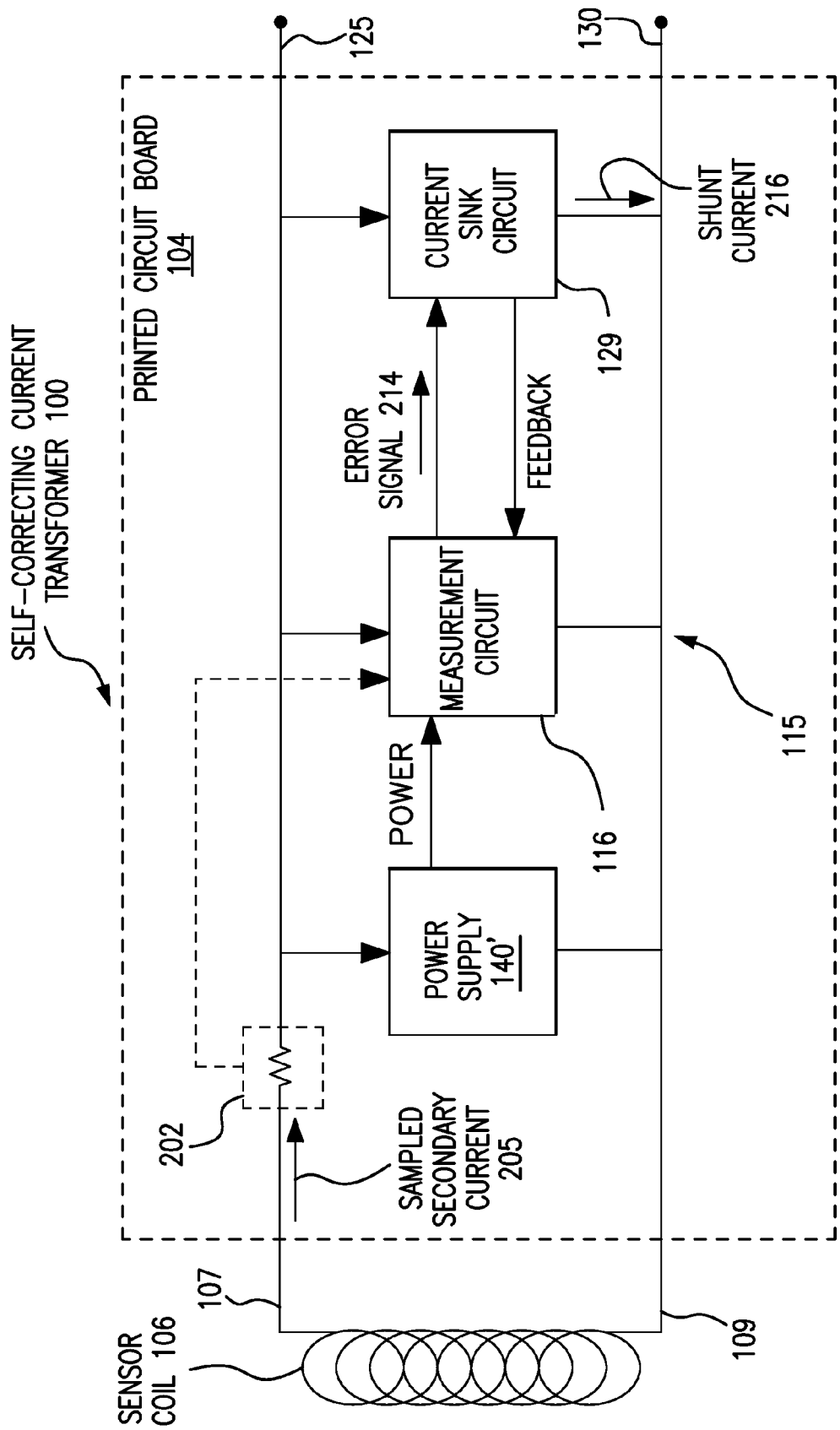
FIG. 2 illustrates an example embodiment of the self-correcting current transformer invention, showing the measurement circuit and current sink circuit.

FIG. 2 illustrates the example embodiment of the invention, showing the measurement and signal conditioning circuits 115 of the self-correcting current transformer 100. The measurement circuit 116 samples the secondary current 205 induced in the sensor coil 106, which passes through the burden resistor 202. The measurement circuit 116 determines an error signal, shown in FIG. 4B, representing how much greater the sampled secondary current 205 is than the target secondary current 404 shown in FIG. 4A. A current sink circuit 129 is electrically connected to the leads 107 and 109 from the sensor coil 106, receives the error signal from the measuring circuit 116. The current sink 129 shunts an amount of current 216 from the leads of the sensor coil to reduce a magnitude of the secondary current 205, so as to match the target secondary current 404.

The example measurement circuit 116 may include calibration data 310 shown in FIG. 4B, to determine the error signal 214 representing how much greater the sampled secondary current 205 is than the target secondary current 404, and outputs the error signal 214. The calibration data 310 in the measurement circuit 116 is prepared at the time of manufacture of the current transformer 113, to adjust the secondary current. The current sink circuit 129 receives the error signal 214 and shunts a corresponding amount of current 216 from the sensor coil 106 to reduce a magnitude of the secondary current output at the terminals 125, 130, to match the target secondary current 404.

Figure 3:
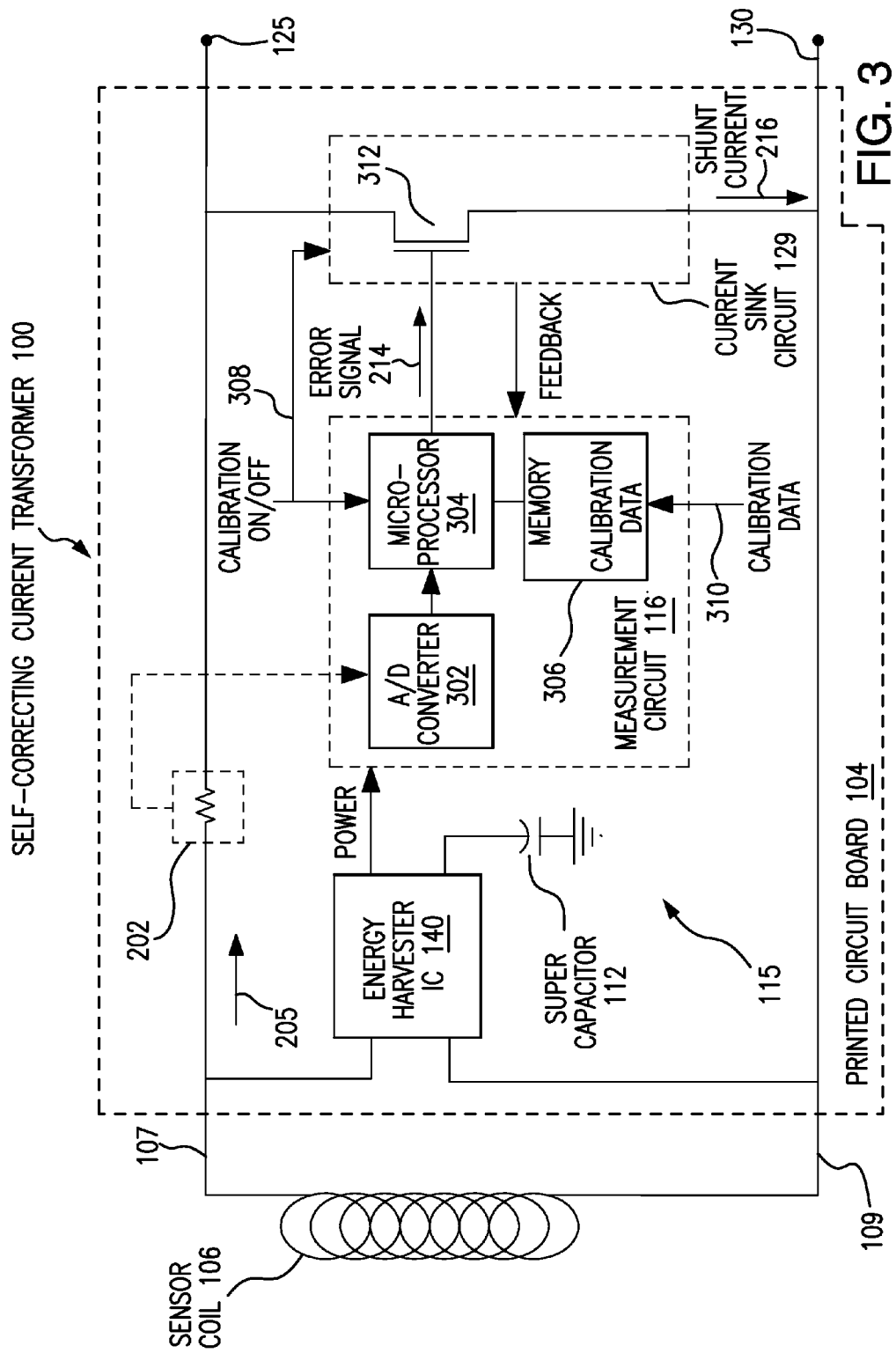
FIG. 3 illustrates an example embodiment of the self-correcting current transformer invention, showing additional details of the measurement circuit and current sink circuit of FIG. 2, wherein the measurement circuit and the current sink circuit are powered by secondary current from the sensor coil.

FIG. 3 illustrates an example embodiment of the self-correcting current transformer invention, showing additional details of the measurement circuit 116 and current sink circuit 129 of FIG. 2. The measurement circuit 116 and the current sink circuit 129 are powered by the secondary current from the sensor coil. The example measurement circuit 116 and the current sink circuit 129 may be powered by an energy harvester integrated circuit (IC) 140 and super capacitor 112 that draw power from the secondary current 205 from the sensor coil 106.

The example measurement circuit 116 may comprise an analog-to-digital converter 302 that samples the secondary current 205 passing through the burden resistor 202. The digital value of the sampled secondary current 205 is output to the microprocessor 304. A memory 306 stores calibration data 310 prepared at the time of manufacture of the transformer, to adjust the secondary current 205. The microprocessor 304 determines the error signal 214 representing how much greater the sampled secondary current 205 is than the target secondary current 404 and outputs the error signal 214 based on calibration data 310.

The example current sink circuit 129 may comprise a field effect transistor 312 operating in a resistive region of operation, with its gate connected to the microprocessor 304, to receive the error signal 214. The field effect transistor (FET) 312 conducts a shunt current 216 from the lead 125 of the sensor coil in response to the error signal 214, to reduce a magnitude of the secondary current 205 so as to match the target secondary current 404. In an alternate embodiment, the example current sink circuit 129 may comprise a transistor switched by pulse width modulation from saturation to off, at a high frequency.

During the manufacture of the example self-correcting current transformer 100, an example calibration process may be performed to compensate for variations in accuracy of transformer's performance characteristics. The calibration on/off input 308 is turned on, setting the microprocessor 304 into calibration mode. The calibration on/off input 308 disables the current sink circuit 129. A primary current is passed through the primary current wire 103, having a sequence on known primary current values, for example from 450 to 550 Amperes. A precision current measuring device is connected to the output terminals 125 and 130 and a corresponding sequence of secondary current 205 values from the sensor coil, is measured, for example from 4.5 to 5.5 Amperes.

A goal of the example calibration process is to make the self-correcting current transformer 100 output a required target secondary current of, for example, 5 Amperes, for a primary current of 500 Amperes. The sensor coil 106 has a number of turns that is less than a target number of turns, to cause the secondary current 205 induced in the sensor coil 106 to be greater than the target secondary current 404 corresponding to a target number of turns. An error signal representing how much greater the measured secondary current 205 is than the target secondary current 404, is determined during the calibration process, for the measured sequence of secondary current 205 values. Based upon the conduction characteristics of the current sink circuit 129, a sequence of values for the error signal 214, is compiled as the calibration data 310. The calibration data 310, may be, for example, the value of the gate potential that is applied to the gate of the FET device 312, to pass the desired shunt current 216, to reduce the magnitude of the secondary current 205 to match the target secondary current 404. The calibration data 310 is then stored in the memory of the measurement circuit 116 at the conclusion of the calibration process.

FIG. 4A illustrates an example graph of secondary current vs primary current in a range 410, 412, for the self-correcting current transformer 100, showing the sampled secondary current 205 output from the sensor coil 106, the target secondary current 404, and the excess sampled secondary current 406 that is to be reduced by the current sink circuit 129 of FIGS. 2 and 3, to proportionally reduce the sensor output current 205 to produce a corrected output current that matches the target secondary current 404, with minimal error.

FIG. 4B illustrates an example graph of the error signal 214 output from the measurement circuit vs the sampled secondary current 205 in a range 410', 412', the error signal 214 being based on the calibration data 310 in the measurement circuit 116, the error signal 214 being input to the current sink circuit 129 of FIGS. 2 and 3.

Although specific example embodiments of the invention have been disclosed, persons of skill in the art will appreciate that changes may be made to the details described for the specific example embodiments, without departing from the spirit and the scope of the invention.

The invention claimed is:

1. A self-correcting current transformer, comprising:

a sensor coil of wire wound about a core, the sensor coil being configured as a secondary coil having a number of turns, the core having a primary current carrying wire as a primary coil, the number of turns of the sensor coil being less than a target number of turns, to cause a secondary current induced in the sensor coil from current in the primary current carrying wire, to be greater than a target secondary current corresponding to the target number of turns;

a measurement circuit electrically connected to leads from the sensor coil, the measurement circuit being configured to sample the secondary current induced in the sensor coil as a measure of primary current in the primary current carrying wire, the measurement circuit being configured to determine an error signal representing how much greater the sampled secondary current is than the target secondary current, and the measurement circuit being configured to output the error signal; and a current sink circuit electrically connected to the leads from the sensor coil, the current sink circuit being configured to receive the error signal from the measurement circuit and to shunt an amount of current from the leads of the sensor coil to reduce a magnitude of the secondary current to match the target secondary current.

2. The self-correcting current transformer of claim 1, wherein the error signal is determined based on calibration data included in the measurement circuit, to reduce the magnitude of the secondary current to match the target secondary current.

3. The self-correcting current transformer of claim 1, wherein the current sink circuit comprises a transistor operating in a resistive region of operation.

4. The self-correcting current transformer of claim 1, wherein the measurement circuit and the current sink circuit are enclosed with the sensor coil in a housing through which the primary current carrying wire may be threaded.

5. The self-correcting current transformer of claim 1, wherein the measurement circuit and the current sink circuit are powered by the secondary current from the sensor coil.

6. The self-correcting current transformer of claim 1, wherein the sensor coil is wound as a toroidal coil about a toroidal core.

* * * * *